US008729679B1

(12) United States Patent
Phua

(10) Patent No.: US 8,729,679 B1
(45) Date of Patent: May 20, 2014

(54) SHIELDING SILICON FROM EXTERNAL RF INTERFERENCE

(71) Applicant: NXP B. V., Eindhoven (NL)

(72) Inventor: Chee Keong Phua, Cupertino, CA (US)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/693,857

(22) Filed: Dec. 4, 2012

(51) Int. Cl.
*H01L 23/552* (2006.01)
(52) U.S. Cl.
USPC ............. 257/659; 257/E23.114; 257/660; 257/E21.599; 438/113
(58) Field of Classification Search
USPC ............. 257/E23.114, 659, 660, E21.599; 438/113
See application file for complete search history.

(56) References Cited

U.S. PATENT DOCUMENTS

| 7,531,407 | B2 * | 5/2009 | Clevenger et al. ............. 438/238 |
| 7,656,031 | B2 * | 2/2010 | Chen et al. .................... 257/733 |
| 7,915,715 | B2 | 3/2011 | Karim et al. |
| 8,063,469 | B2 | 11/2011 | Barth et al. |
| 8,093,690 | B2 | 1/2012 | Ko et al. |
| 8,169,059 | B2 | 5/2012 | Barth et al. |
| 8,183,971 | B2 | 5/2012 | Le Guillou et al. |
| 8,217,474 | B2 | 7/2012 | Tiemeijer |
| 2011/0050383 | A1 | 3/2011 | Tiemeijer |

FOREIGN PATENT DOCUMENTS

EP 2 413 347 A1 2/2012

OTHER PUBLICATIONS

Kumar, D., et al.; "Advances in Conductive Polymers"; Eur. Polym. J., vol. 34, No. 8; Elsevier Science; pp. 1053-1060 (1998).
Zoschke, K., et al.; Süss MicroTec; "Polyimide based Temporary Wafter Bonding Technology for High Temperature Compliant TSV Backside Processing and Thin Device Handling" 10 pages (2012).
STATSChipPac; "Through Silicon Via (TSV)" 2 pages (Mar. 2112).
ASE Group; "Advanced Technology—Wafer Level Integration Passive Device Technology"; retrieved from the internet http://www.aseglobal.com/en/Technology/AdvancedTechnology.asp; (Sep. 12, 2012).
Bauer, Tomas; "First High Volume Via Process for Packaging and Integration of MEMS/CMOS"; Silex Microsystems, Sweden; 6 pages.

* cited by examiner

*Primary Examiner* — Telly Green
*Assistant Examiner* — Paul Patton

(57) ABSTRACT

Consistent with an example embodiment, there is an integrated circuit device (IC) built on a substrate of a thickness. The IC comprises an active device region of a shape, the active device region having a topside and an underside. Through silicon vias (TSVs) surround the active device region, the TSVs having a depth defined by the substrate thickness. On the underside of and having the shape of the active device region, is an insulating layer. A thin-film conductive shield is on the insulating layer, the conductive shield is in electrical contact with the TSVs.

18 Claims, 7 Drawing Sheets

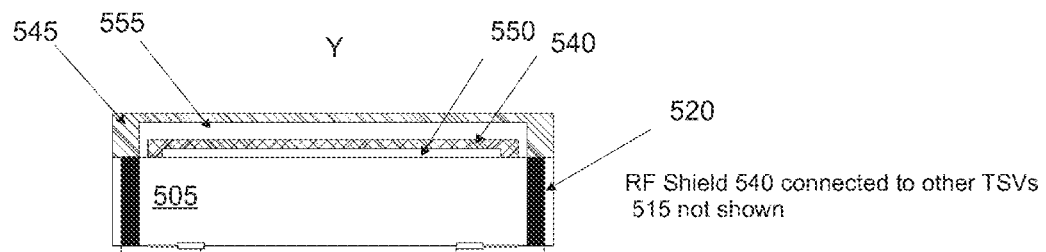
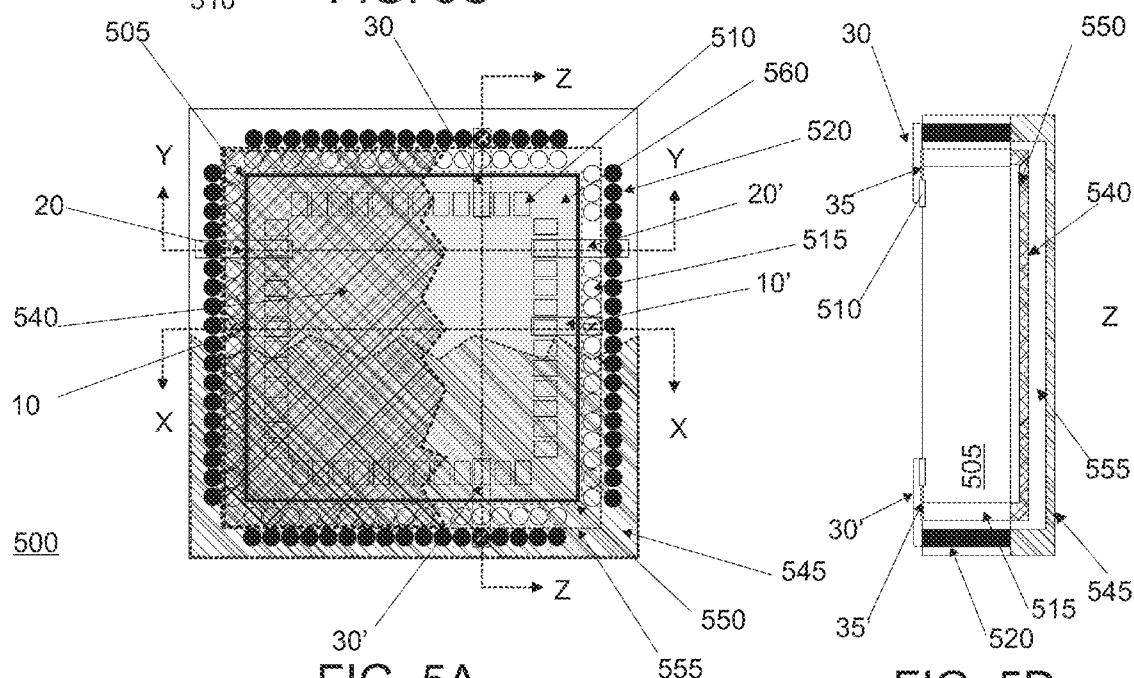
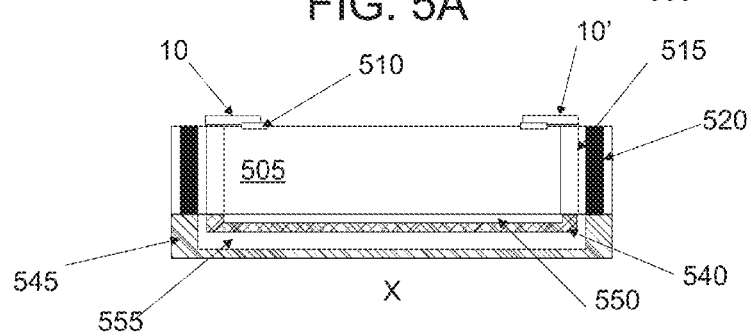

SHIELDING SILICON FROM EXTERNAL RF INTERFERENCE

FIELD

This disclosure relates to radio frequency (RF) shielding for integrated circuits. This disclosure further relates to RF shielding and other components which may be incorporated into an integrated circuit device during processing.

BACKGROUND

The electronics industry continues to rely upon advances in semiconductor technologies to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

Each of these semiconductor devices generally includes a semiconductor substrate on which a number of active devices are formed. The particular structure of a given active device can vary between device types. For example, in MOS transistors, an active device generally includes source and drain regions and a gate electrode that modulates current between the source and the drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

As more devices and features are incorporated into integrated circuit (IC) devices and more IC devices inserted into a system, such as portable electronic devices (i.e., PDAs, laptop computers, smart-phones, etc.) the appropriate use of the available space becomes a challenge. In these applications, especially in mobile devices integrated circuits often require some form of shielding from external RF Interference. However, such shielding must take into account the limited available space.

There exists a need for shielding that protects the susceptible systems from RF interference, yet be efficient in use of space.

SUMMARY

The embodiments described in the present disclosure have been found useful in providing for additional components on the underside of an integrated circuit device (IC). These components are coupled to the IC with through substrate vias (TSVs) and as such do not add to the device thickness. One such component provides for RF shielding by the forming of a thin-film ground/power plane coupled to the IC power/ground connections. Other components, such as capacitors, inductors, and resistors may be fabricated, as well. The TSVs may either be defined during wafer processing of the IC or through a post process applied to the completed wafer.

According to an example embodiment, an integrated circuit device (IC) is built on a substrate of a thickness; the IC comprises an active device region of a shape, the active device region has a topside and an underside. Through silicon vias (TSVs) surround the active device region; the TSVs have a depth defined by the substrate thickness. There is an insulating layer on the underside of and it has the shape of the active device region. A thin-film conductive shield is on the insulating layer, the conductive shield in electrical contact with the TSVs.

According to another example embodiment, an integrated circuit device (IC) is built on a substrate of a thickness; the IC comprises an active device region of a shape, the active device region has a topside and an underside. Through silicon vias (TSVs) surround the active device region, the TSVs have a depth defined by the substrate thickness. There is an insulating layer on the underside of and having the shape of the active device region. A thin-film conductive shield is on the insulating layer, the conductive shield is in contact with the TSVs; an additional thin-film conductive shield is defined on the topside of the active device region, the additional thin-film conductive shield in contact with the TSVs. The thin-film conductive shield and the additional thin-film conductive shield are electrically connected to one another.

According to an example embodiment, an integrated circuit device (IC) is built on a substrate of a thickness. The IC comprises an active device region of a shape, the active device region having a topside and an underside and contact pads on the topside. A first group of through silicon vias (TSVs) surrounds the active device region, the TSVs have a depth defined by the substrate thickness; there is an insulating layer on the underside of and it has the shape of the active device region. A thin-film conductive layer is on the insulating layer, the conductive layer is in electrical contact with the TSVs; on the thin-film conductive layer, there is an additional insulating later. An additional thin-film conductive layer is on the additional insulating layer and the additional thin-film conductive shield is in contact with an additional group of TSVs. The thin-film conductive layer and the additional thin-film conductive layer are configured to, at least one of the following: RF shields, ground planes, power planes, one or more inductors, one or more capacitors, one or more inductor/capacitor (LC) networks, resistor structures; The thin-film conductive layer and the additional thin-film conductive layer are coupled to one another and to selected contact pads of the active device.

According to an example embodiment, a method for adding components to an underside of an integrated circuit comprises, defining the integrated circuit as candidate for underside components. On a wafer substrate, a configuration of TSVs surrounding integrated circuit die is defined. Thin-film conductive layers and insulating layers are applied, the thin film conductive layers making contact to TSVs. The thin-film conductive layers are configured as components, the components electrically coupled with selected contacts on the integrated circuit die The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which:

FIGS. 2A-2E depict an example embodiment according to the present disclosure wherein:

FIG. 2A illustrates the through silicon vias (TSVs) surrounding the active device;

FIG. 2B illustrates in side view the TSVs and the underside of wafer substrate before back grinding of FIG. 2A;

FIG. 2C depicts the side view of FIG. 2B with TSVs exposed on the underside;

FIG. 2D shows the addition of an insulating layer under the active device; and

FIG. 2E shows the defining of a conductive shield layer that covers the insulating layer and connects to the TSV;

FIGS. 5A-5D depict an example embodiment according to the disclosure of an active device surrounded by two sets of TSVs, each set of TSVs assigned a first conductive shield and an additional conductive shield;

Figure 1A:
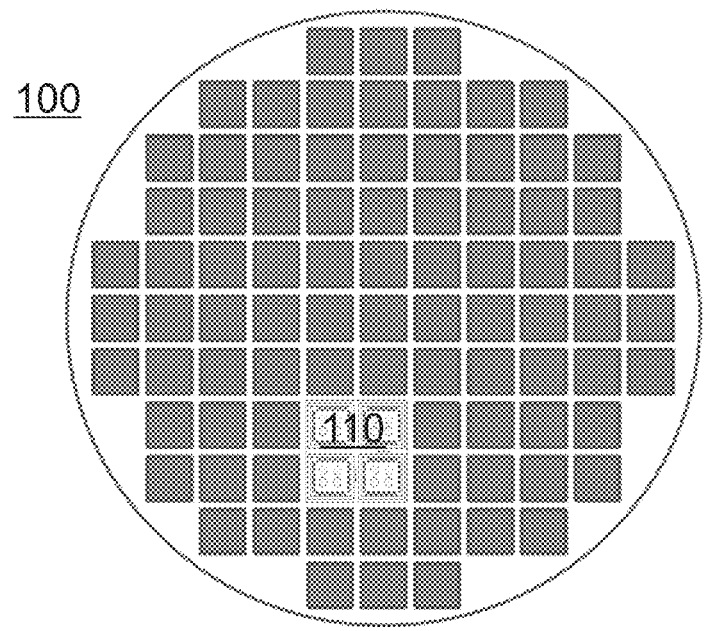
FIG. 1A is an example wafer substrate of devices after electrical sorting (E-sort) showing a group of four active devices.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in incorporating RF shielding on an active device from its underside. This shielding is integral to the device and does not add significantly to the finished active device's thickness profile; use of an external shield is eliminated, obviating the need for shielding on a printed circuit board (PCB) level. The active device is surrounded with through silicon vias (TSVs) to which an RF shield may be coupled. The active device may be an arbitrary shape, usually rectangular, having a top-side and an underside. Depth of the TSV is defined by the thickness of the active device region and/or wafer substrate. On the underside of the active device region, there is an insulating layer on the underside and corresponding in shape to the active device region. Upon this insulating layer there is a thin-film conductive shield. The thin-film conductive shield is in electrical contact with the TSVs which in turn may be connected to voltage or ground references within the active device region. The thin-film conductive shield may comprise copper, aluminum, gold, silver, poly-crystalline silicon, and alloys thereof, but not necessarily limited to these materials.

In other applications, conductive polymers (i.e., intrinsically conducting polymers, etc.) may be suitable. Information on conductive polymers may be found in the article titled, "Advances in Conductive Polymers" of D. Kumar and R. C. Sharma, University of Delhi, India (1998 Eur. Polymer Journal Vol. 34, No. 8, pp. 1053-1060).

In one example process, the TSVs may be defined during the fabrication of the active device regions, as the wafer substrate is processed. As the layers of the active device regions are built up with a modern wafer fabrication process, in situ the TSVs may be placed along the active device perimeters. Of course, the TSV process is designed to be compatible with the process that fabricates the active device regions. Incorporated by reference in its entirety, U.S. Pat. No. 8,169,059 issued on May 1, 2012, of Hans-Joachim Barth et at titled, "On-Chip RF Shields with Through Substrate Conductors," describes an example process for forming TSVs.

In another example process, the TSVs may be defined after the fabrication of the active device regions on the wafer substrate. A number of organizations offer their services to add TSVs on the finished wafer substrate containing the active devices. These organizations may include, but are not necessarily limited to, are shown in Table 1.

TABLE 1

Example Organizations that add TSVs to Finished Wafer Substrates

| Organization Name | Location |
| --- | --- |
| ALLVIA | Sunnyvale, California USA |
| AMKOR TECHNOLOGY | Chandler, Arizona USA |
| ASE GROUP | Kaohsiung, Taiwan |
| STATSCHIPPAC | Ang Mo Kio, Singapore |
| SILEX MICROSYSTEMS | Stockholm, Sweden |
| SUSS MICROTEC | Oberschleissheim, Germany |

Having defined the through silicon vias (TSVs) in situ by processing along with the active device die or by processing the wafer through additional steps after the active device die are completed, an RF shield may be defined on the underside of the wafer with a thin-film process. The thin-film RF shield is connected to the TSVs; the TSVs in turn, may be connected to power ($V_{DD}$) or ground ($V_{SS}$). Thus, the RF shield does not add additional thickness to the active device die that would consume any appreciable space within a portable electronic system in which packing as much performance in a small space is important. Some thin-film processes that may be used to apply the RF shield include, but are not limited to, physical vapor deposition (PVD), chemical vapor deposition (CVD), plasma enhanced CVD (PECVD), and sputtering.

In one example TSV process outlined in a publication of K. Zoschke et al. titled, "Polyimide base Temporary Wafer Bonding Technology for High Temperature Compliant TSV Backside Processing and Thin Device Handling" SUSS Microtec. pp. 10. Such a process is most suitable for wafers of less than 100 μm thickness. At present TSVs are manufactured in that range of depth. The RF shield of the present disclosure may then be applied to a TSV post-processed a wafer having active devices.

Figure 1B:
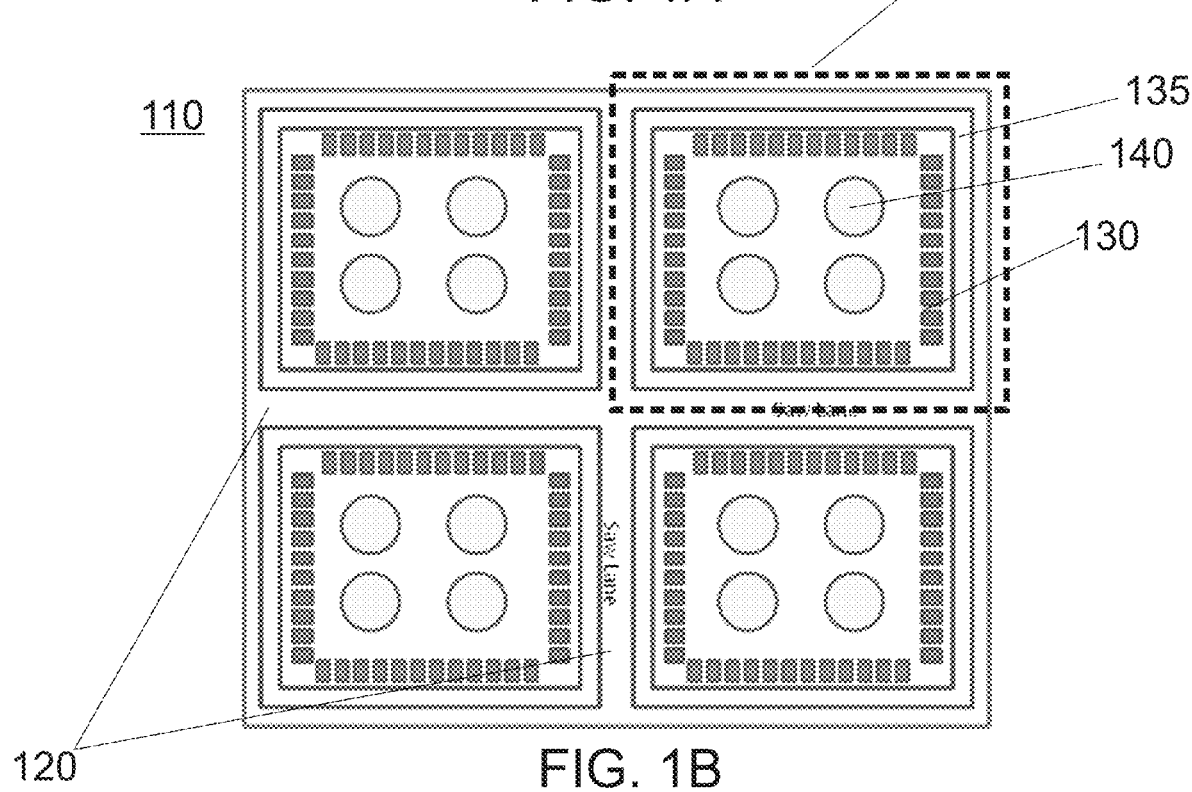
FIG. 1B is an enlarged view of the four active devices depicted in FIG. 1A.
Figure 2A:
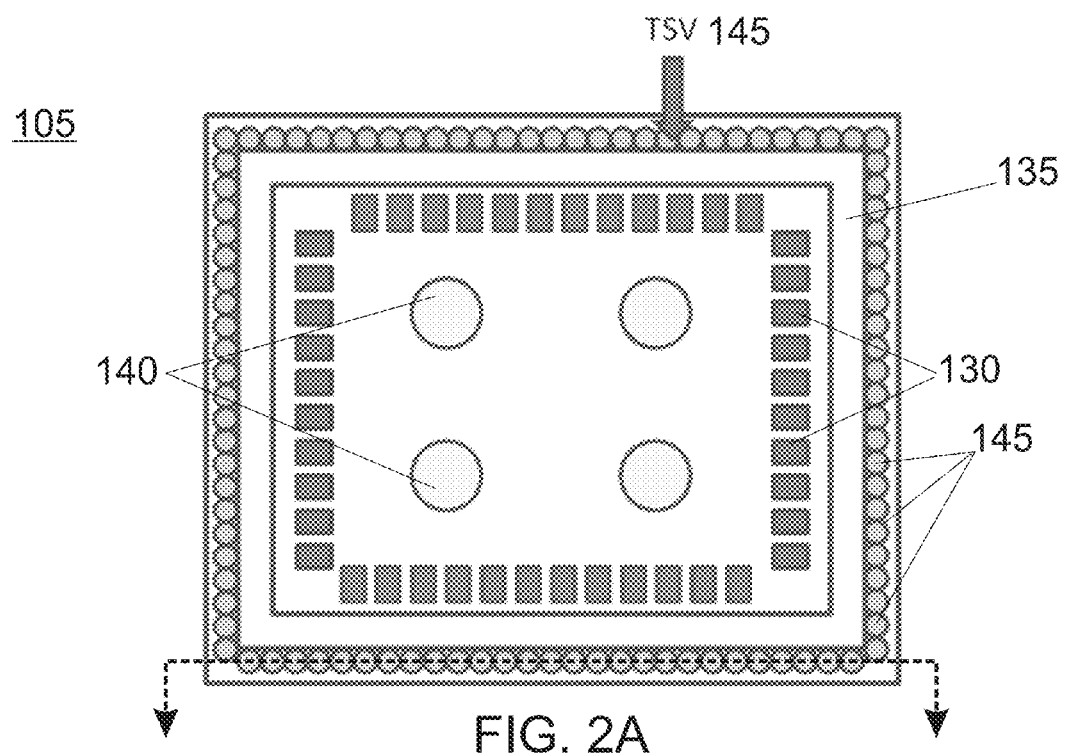
Figure 2B:
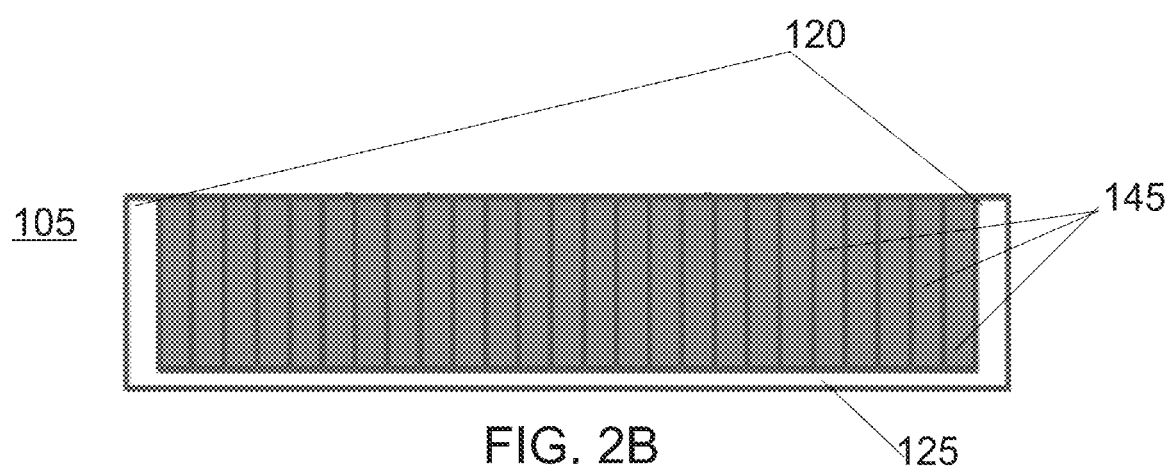
Figure 2C:
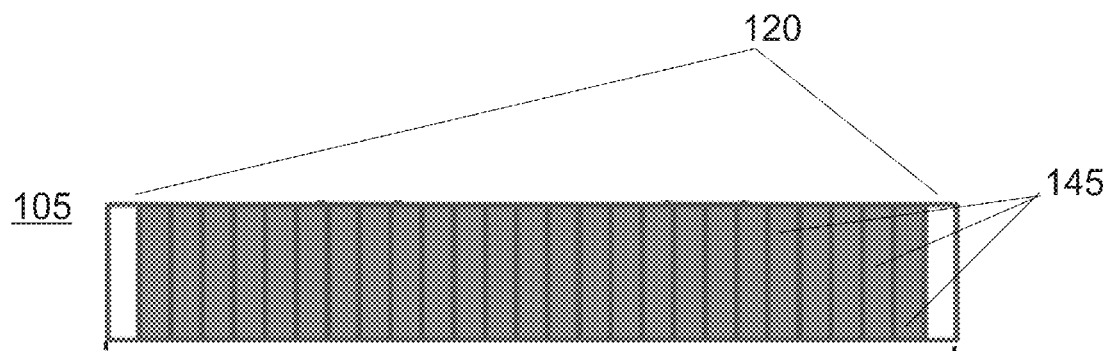
Figure 2D:
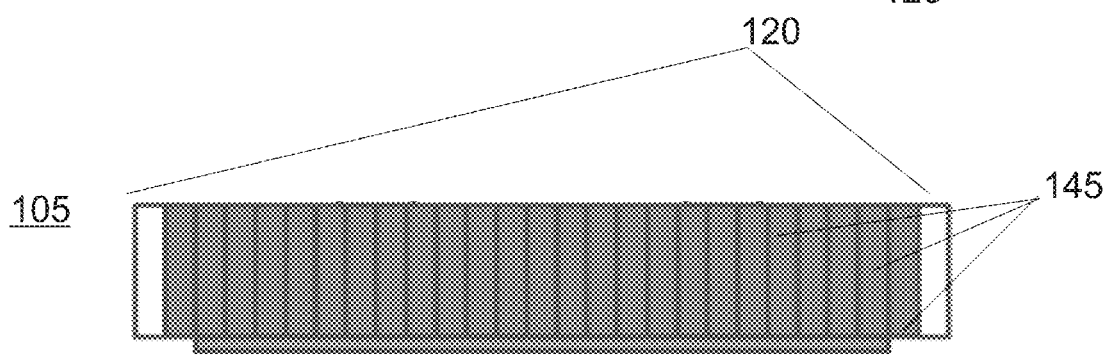
Figure 2E:
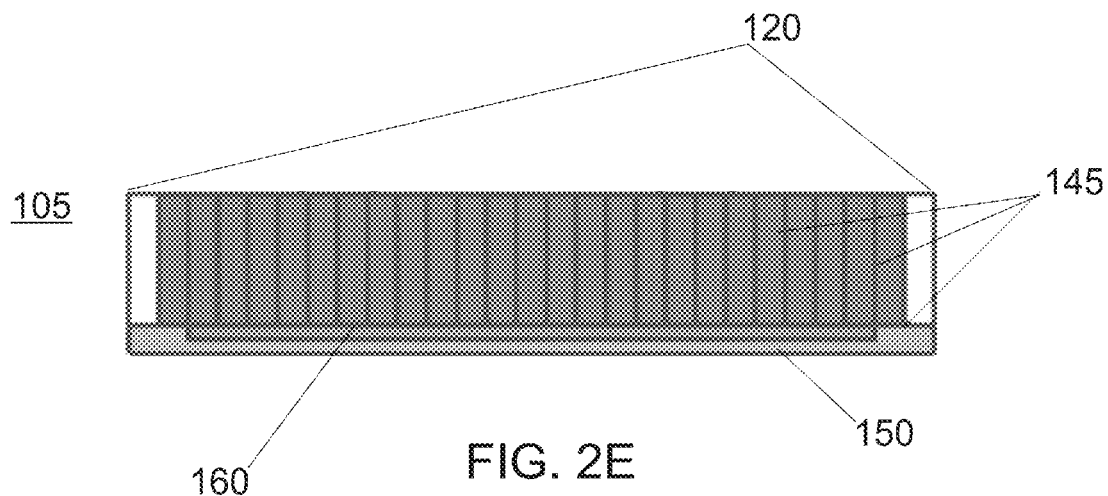
Figure 4:
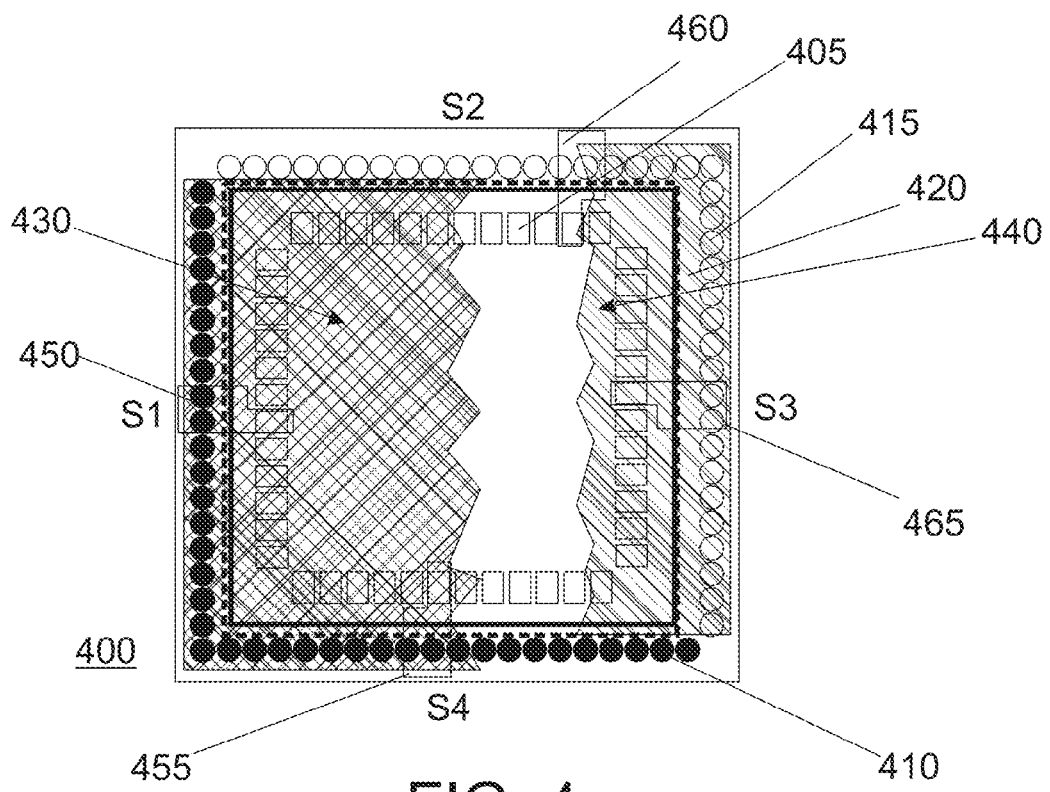
FIG. 4 depicts another example embodiment according to the present disclosure, of additional conductive shield layers as depicted in FIG. 3.

In an example embodiment according to the disclosure, a wafer 100 undergoes processing to yield active devices. Four active devices 110 are illustrated. These active devices 105 are subjected to electrical testing (i.e., E-sort, etc.) to cull out failures (FIGS. 1A-1B). To add the RF shield, the wafer goes through additional processing. Within the saw lane 120 or in areas identified for shielding, TSVs 145 are defined in the active device 105 (FIG. 2A). Sufficient space is available for the TSVs in that the saw lane in an example process may range from about 50 μm to about 100 μm. With a saw blade having a kerf of about 20 μm, there is about 30 μm to about 70

μm space which may accommodate the TSVs. Further space for the TSVs can be defined at the perimeter of the active device 135. The TSVs 145 have a depth comparable to that of the active device 105. Active device 105 has a predetermined number of bond pads 130. Ball bonds 140 provide additional electrical contact points. In FIG. 4, the underside 125 of the active device and TSVs 145 are shown.

Refer to FIGS. 2A-2E. The underside 125 is ground off to reveal the TSVs 145. Upon the TSVs an insulating layer 150 is applied. Upon the insulating layer 150 an RF shield 160 is applied with a thin-film process. This RF shield 150 is electrically connected to the TSVs 145. Further, the RF shield 160 may be electrically connected to the active device 105 at one or more bond pads 130. These chosen bond pads 130 may include power or ground. After the RF shield has been applied, the active devices 105 are sawed apart.

In another example embodiment, the RF shield 160 may be applied directly to the underside of the wafer substrate after back grinding exposes the TSVs. Depending upon the substrate type, the underside of the wafer may be a sufficient electrical insulator so as to not require an additional insulating layer to be added.

In another example embodiment, on the underside of an active device, two thin-film metal layers may be sandwiched together separated by an insulating layer. This structure becomes a large capacitor which may be used for DC power supply decoupling; one plate is connected to power and the other connected to ground.

Figure 3:
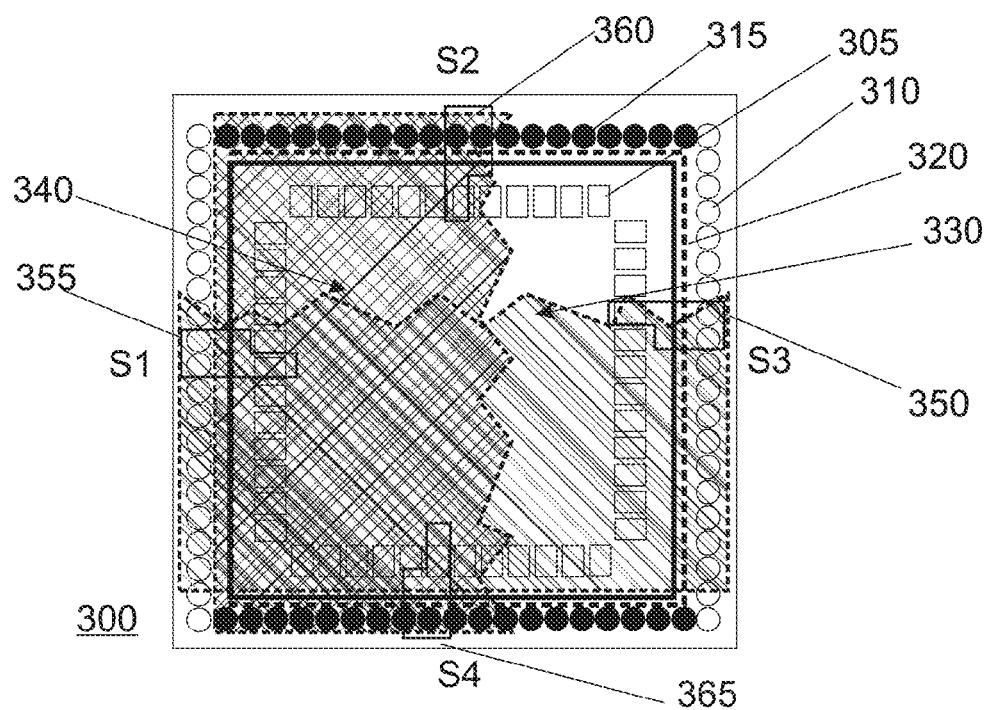
FIG. 3 depicts another example embodiment according to the disclosure of additional conductive shield layers built on top of a first conductive shield layer (as depicted in FIG. 2E)

Refer to FIG. 3. An example device 400 has a first set of TSVs 310 and a second set of TSVs 315. The first set of TSVs 310, are on the first and opposite third side (S1, S3) of the active device die 300 having bond pads 305. A first thin-film shield 330 is applied to the underside of the active device 300. The first thin-film shield 330 is connected to the first set of TSVs 310. Electrical connectors 350 and 355 connect to bond pads on the active device 300. The potential may be defined as VDD or VSS.

The second set of TSVs 315, are on the second and opposite fourth side (S2, S4). Electrical connectors 360 and 365 connect to selected bond pads 305 on the active device 300, as well; these connectors 360 and 365 will be likely, at a different potential than electrical connectors 350 and 355. The second thin-film shield 340 is connected to the second set of TSVs 315. To isolate the first thin-film shield 330 from the second thin-film shield 340 and insulating layer 320 lies between them. The voltage for this thin-film shield 340 is likely different than that of the first thin film shield 330.

Refer to FIG. 4. In an example embodiment, on an active device 400 having bond pads 405, a first set of TSVs 410 are on the first and perpendicular fourth side (S1, S4). A first thin-film shield 430 is applied to the underside of the active device 400. Depending upon the specific wafer process used to make the active device 400, there may be a insulating layer (not illustrated) on the underside; the first thin-film shield 430 is applied to the underside and connected to the first set of TSVs 410. Electrical connectors 450 and 455 connect to selected bond pads 405 on the active device 400; these electrical connections are connected to the first thin-film shield 430.

A second set of TSVs 415 are on the second and perpendicular third side (S2, S3). Electrical connectors 460 and 465 connect to selected bond pads 405 on the active device 400. An insulating layer 420 is applied to the first thin-film shield 430. Upon the insulating layer 420, a second thin-film shield 440 is applied. The second thin-film shield 440 is connected to the second set of TSVs 415 which is connected to electrical connectors 460 and 465.

In an example application, the voltage at the first thin-film shield 430 and the voltage at second thin-film shield 440 may be defined as $V_{DD}$ and $V_{SS}$, respectively. If VDD is power and VSS is ground, the two thin-film shields 430, 440 having an insulating layer 420 between them serves as a large plate de-coupling capacitor.

In the previous examples, one row of TSVs surrounds the active device and this one row may be separated into one or more sets of TSVs which may be assigned to particular bond pads and be assigned different thin-film shields each assigned to a particular voltage. In another example embodiment, an active device die may have two or more rows of TSVs surrounding it. Two or more thin-film shield layers may be defined on the active device underside and be assigned to either row of TSVs or partial rows of TSVs.

Refer to FIGS. 5A-5D. In an example embodiment, a semiconductor device 500 built according to the present disclosure, has an active device 505 is surrounded by a inner ring of TSVs 515 and an outer ring of TSVs 520. The active device 505 has bond pads 510. The number of bond pads in a device is governed by the needs of a particular application. The use of TSVs to provide RF shielding may be applied to an active device having several bond pads to one having hundreds. The larger active device requires more TSVs to achieve the RF shielding desired.

Taking a cross-section "X," as shown in FIG. 5B, two bonding pads 510 may be selected at locations 10 and 10' to connect the active device 505 to the inner ring of TSVs 515 and the first thin-film shield 540. On the underside of active device 505 is an insulating layer 550. The first thin-film shield 540 on the insulating layer 550. A second insulating layer 555 on the first thin-film shield 540. A second thin-film shield 545 is on the second insulating layer 555.

Taking cross-section "Y," as shown in FIG. 5C, two bonding pads 510 may be selected at locations 20 and 20' to connect the active device 505 to the outer ring of TSVs 520 and the second thin film shield 545. Also note, that inner ring TSVs crossed-over by locations 20 and 20' may be omitted so as to avoid short-circuiting the connection from locations 20 and 20' to the outer ring of TSVs 520.

Taking cross-section "Z," as shown in FIG. 5D, two bonding pads 510 may be selected at locations 30 and 30' to connect the active device 505 to the outer ring of TSVs 520 and the second thin-film shield 545. In this case, an additional passivation layer 35 and 35' may be added (during device fabrication) so the connection 30 and 30' does not connect to a TSV of the inner ring of TSVs 515.

Figure 6A:
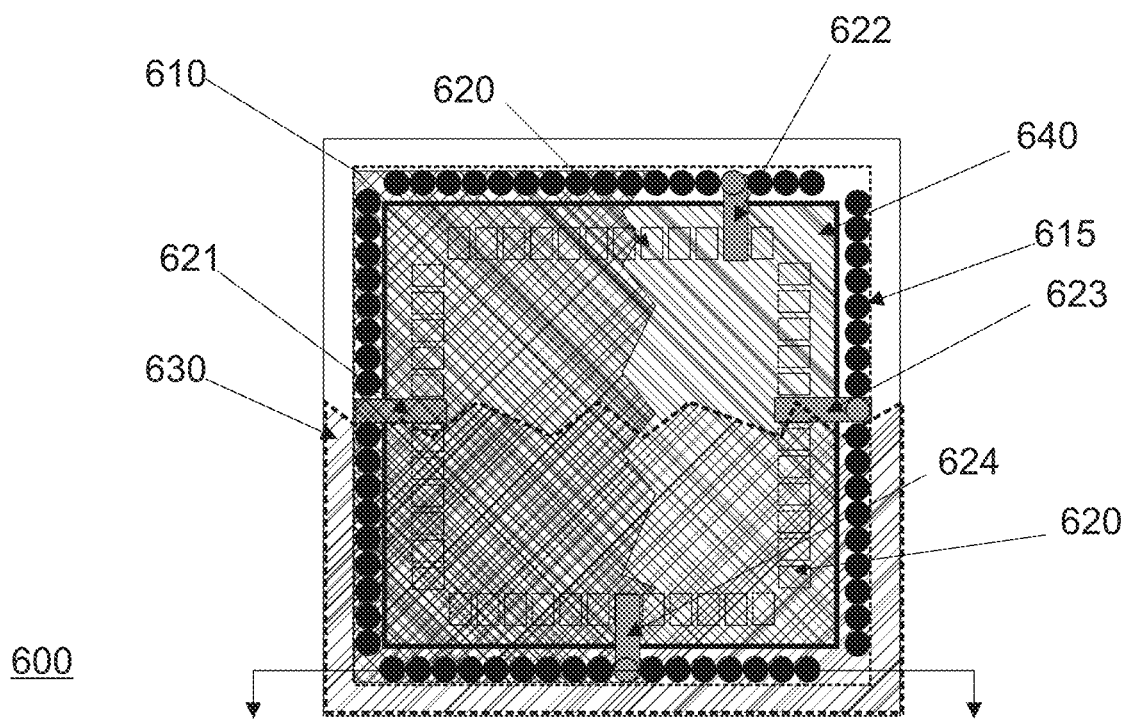
FIGS. 6A-6B depict an example embodiment according to the disclosure of a active device sandwiched between a topside thin-film shield and underside thin-film.
Figure 6B:
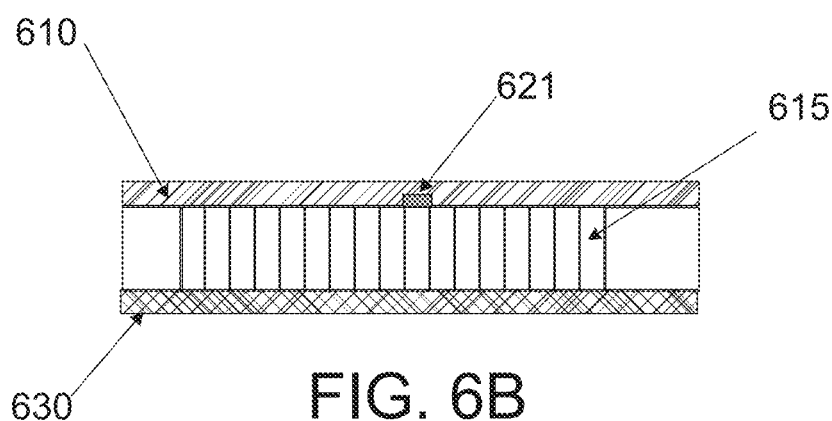

In another example embodiment, an additional thin-film RF shield may be defined on the topside of the active device. This topside RF shield may be connected to ground, as well. The active device is then RF shielded from all sides, top, bottom, and by the TSVs surrounding it. Refer to FIGS. 6A-6B. An active device 600 is surrounded by TSVs 615. On the underside an insulating layer 610 may be applied to the underside of the active device 600. Upon the insulating layer 610 the underside RF shield 630 is applied, the RF shield 630 is connected to the TSVs 615. On the topside of the active device 600, a dielectric layer 640 protects exposed bond pads from the topside RF shield 610. In this example, bond pads 620, 621, 622, and 623 are connected to the TSVs 615 and the bottom RF shield 630. The topside RF shield 610 of course, is configured to accommodate the other bond pads 620, the user requiring access for bonding the active device 600 to the overall system application circuit board.

Although the afore-mentioned discussion is directed toward the building of RF shielding and elementary capacitor structures on the wafer underside, the techniques described are not so limited. For example, the capacitor structure may be configured by use of fractal geometry; a Hilbert curve provides for capacitive structures of increased unit capacitance in a reduced layout area and is compatible with modern sub-micron fabrication technology. A discussion of this example capacitive structure may be found in published European Patent Application (Pub. No. EP 2 413 347 A1, Pub. Date 1 Feb. 2012) of Saleem Kala and is incorporated by reference.

In another example, an "8-Shaped Inductor" may be used as an inductor on the wafer underside, as described in U.S. Pat. No. 8,183,971 B2 (Issued on 22 May 2012) of Yann Le Guillou and Bassem Fahs. In an example, the "Planar Inductor" may be also be used, as described in U.S. Pat. No. 8,217,747 B2 (Issued on 10 Jul. 2012). In yet another example, a "Planar Inductive Unit and an Electronic Device Comprising a Planar Inductive Unit" may be used, as described in US Patent Publication 20011/0050383 A1 (Published on 3 Mar. 2011) of Lukas Frederik Tiemeijer. These US patent publications are incorporated by reference in their entirety.

Thus, it is possible to construct LC circuits including capacitor and inductor structures by augmenting the techniques outlined in the present disclosure. In other applications, with appropriate semiconducting materials (e.g. doped poly-silicon) resistor structures may be constructed, as well.

Figure 7:
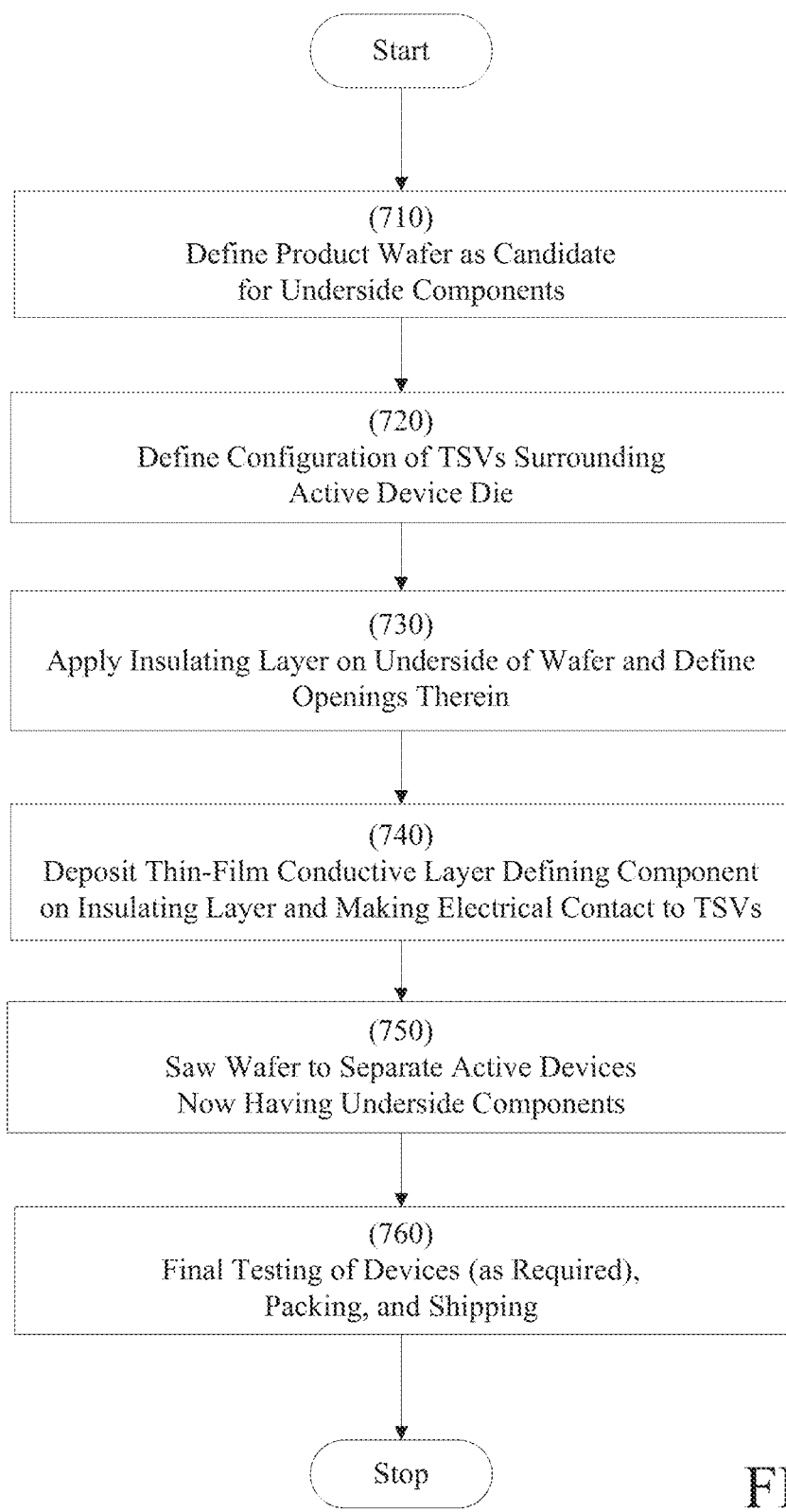
FIG. 7 is a flow diagram of a process to define underside components according to an embodiment of the present disclosure.

Refer to FIG. 7. According to the disclosure, the general technique for fabricating components on the undersides of active device die may be described. The particular product is defined as a candidate for use of underside components, such as capacitors and inductors 710. The TSVs are configured per device requirements 720; the particular arrangement for TSVs may be chosen from examples discussed. An insulating layer is applied to the underside wafer 730. The insulating layer may be a flexible die-attach film (DAF) or equivalent. The TSVs may be defined in a post-wafer process. In other cases, the TSVs may be defined during active device processing. A thin-film conductive layer is deposited to define the particular component required 740; multiple thin-film conductive layers and insulating layers may be defined to build the desired component with the appropriate capacitance or inductance value. These components have electrical connection to the active device via the TSVs. The wafer is sawed to separate devices now having underside components 750. Separated devices may be placed in electronic packaging, as required. Devices undergo a "final electrical test, as required and then are packed and shipped to the end user 760.

Numerous other embodiments of the invention will be apparent to persons skilled in the art without departing from the spirit and scope of the invention as defined in the appended claims.

The invention claimed is:

1. An integrated circuit device (IC) built on a substrate of a thickness, the IC comprising:
    an active device region of a shape, the active device region having a topside and an underside;
    through silicon vias (TSVs) surrounding the active device region, the TSVs having a depth defined by the substrate thickness;
    an insulating layer on the underside of and having the shape of the active device region;
    a thin-film conductive shield on the insulating layer, the conductive shield in electrical contact with the TSVs; and
    wherein the TSVs are apportioned into a first group of TSVs and an additional group of TSVs.

2. The IC device as recited in claim 1, further comprising,
    an additional insulating later on the thin-film conductive shield; and
    an additional thin-film conductive layer on the additional insulating layer, the additional thin-film conductive shield in contact with the additional group of TSVs.

3. The IC device as recited in claim 2,
    wherein the first group of TSVs are in contact with the thin-film conductive shield; and
    wherein the additional group of TSVs are in contact with the additional thin-film conductive shield.

4. The IC device as recited in claim 3,
    wherein the first group of TSVs are arranged in an area adjacent to a first side of the active device region and in a corresponding area opposite the first side of the active device region; and
    wherein the additional group of TSVs are arranged in an area adjacent to a second side of the active device region, the second side perpendicular to the first side of the active device region and in a corresponding area opposite the second side of the active device region.

5. The IC device as recited claim 2,
    wherein the first group of TSVs are arranged in an area adjacent to a first side of the active device region and in an area adjacent to a second side of the active device region, the first side of the active device region perpendicular to the second side of the active device region; and
    wherein the second group of TSVs are arranged in a corresponding area opposite the first side and second side of the active device region.

6. The IC device as recited in claim 2,
    wherein the first group of TSVs surrounds the active device region; and
    wherein the second group of TSVs surrounds the first group of TSVs.

7. The IC device as recited in claim 1, wherein the thin-film conductive shield has been defined by at least one of the following:
    Vacuum Deposition
    Physical Vapor Deposition (PVD)
    Chemical Vapor Deposition (CVD);
    Plasma-Enhanced CVD; and
    Sputtering.

8. The IC device as recited in claim 7, wherein the thin-film conductive shield comprises, copper (Cu), aluminum (Al), gold (Au), silver (Ag), poly-crystalline silicon (Poly-Si), and alloys thereof.

9. The IC device as recited in claim 7, wherein the thin-film conductive shield comprises conductive polymers and instrinsically conductive polymers.

10. The IC device as recited in claim 1, wherein the thin-film conductive shield is coupled to the active device.

11. The IC device as recited in claim 3, wherein the thin-film conductive shield is coupled to power or ground of the active device.

12. An integrated circuit device (IC) built on a substrate of a thickness, the IC comprising:
    an active device region of a shape, the active device region having a topside and an underside;
    through silicon vias (TSVs) surrounding the active device region, the TSVs having a depth defined by the substrate thickness;
    an insulating layer on the underside of and having the shape of the active device region; and
    a thin-film conductive shield on the insulating layer, the conductive shield in contact with the TSVs;

an additional thin-film conductive shield defined on the topside of the active device region, the additional thin-film conductive shield in contact with the TSVs,
wherein the thin-film conductive shield and the additional thin-film conductive shield are electrically connected to one another.

13. An integrated circuit device (IC) built on a substrate of a thickness, the IC comprising:
an active device region of a shape, the active device region having a topside and an underside and contact pads on the topside;
a first group of through silicon vias (TSVs) surrounding the active device region, the TSVs having a depth defined by the substrate thickness;
an insulating layer on the underside of and having the shape of the active device region; and
a thin-film conductive layer on the insulating layer, the conductive layer in electrical contact with the TSVs,
an additional insulating later on the thin-film conductive shield; and
an additional thin-film conductive layer on the additional insulating layer, the additional thin-film conductive shield in contact with an additional group of TSVs;
wherein the thin-film conductive layer and the additional thin-film conductive layer are configured to, at least one of the following,
RF shields,
ground planes,
power planes,
one or more inductors,
one or more capacitors,
one or more inductor/capacitor (LC) networks,
resistor structures, and
wherein the thin-film conductive layer and the additional thin-film conductive layer are coupled to one another and to selected contact pads of the active device.

14. The integrated circuit as recited in claim 13, wherein the one or more capacitors are configured to at least one of the following: a plate capacitor, a Hilbert capacitor, or combination thereof.

15. The integrated circuit as recited in claim 13, wherein one or more inductors are configured to at least one of the following: an "8-shaped inductor," a planar inductor, or combination thereof.

16. A method for adding a shield to an underside of an integrated circuit, the method comprising:
defining the integrated circuit as candidate for an underside shield;
defining a first group and an additional group of TSVs surrounding integrated circuit die, the integrated circuit die on a wafer substrate;
applying a thin-film conductive layer and an insulating layer, the thin film conductive layer making contact to the TSVs; and
wherein the thin-film conductive layer is configured as the shield, the shield electrically coupled with selected contacts on the integrated circuit die.

17. The method as recited in claim 16, further comprising, sawing the wafer substrate into individual device die, the individual device die now having the underside shield.

18. The method as recited in claim 16, further comprising adding at least one of the following to the integrated circuit: ground planes, power planes, one or more inductors, one or more capacitors, one or more inductor/capacitor (LC) networks, resistor structures.

* * * * *